United States Patent [19]

Baldwin et al.

[11] 4,441,195
[45] Apr. 3, 1984

[54] SHORT TERM RESPONSE ENHANCEMENT FOR DIGITAL PHASE-LOCKED LOOP

[75] Inventors: David R. Baldwin; Nicholas S. Lemak, both of Phoenix, Ariz.

[73] Assignee: Honeywell Information Systems Inc., Phoenix, Ariz.

[21] Appl. No.: 251,846

[22] Filed: Jul. 10, 1981

[51] Int. Cl.³ .............................................. H03L 7/18
[52] U.S. Cl. ...................................... 377/2; 375/120; 328/155; 331/11
[58] Field of Search ...................... 364/721; 375/120; 235/310

[56] References Cited

U.S. PATENT DOCUMENTS 4,242,639 12/1980 Boone .
4,375,694 3/1983 Kuhn ................................. 375/120

Primary Examiner—Joseph A. Orsino, Jr.
Assistant Examiner—Timothy K. Greer
Attorney, Agent, or Firm—A. A. Sapelli; W. W. Holloway, Jr.; L. J. Marhoefer

[57] ABSTRACT

A short term response enhancement for a digital phase-locked loop is implemented to provide a relatively major change in the phase of the output signal over a relatively short period of time. The basic digital phase-locked loop determines the average number of pulses from a clock source which occur or are expected to occur between successive occurrences of the input signal to the digital phase-locked loop, and compares the number of pulses counted from the occurrence of the last output signal with the average number of pulses expected to occur, producing an output signal when the two numbers agree. The number of pulses which occur between successive cycles of the input signal are also compared against the previously determined average. A count which differs from the average count indicates a change in phase of the input signal. The present invention takes the absolute value of the measured error and, based upon the prior modification made during the previous two cycles of the input signal to the count sequence modifies the count sequence of the counter which is counting the number of pulses from the last output signal, by either adding one or subtracting one from the count sequence, thereby effecting a relatively major change in the phase of the output signal over a relatively short period of time.

2 Claims, 18 Drawing Figures

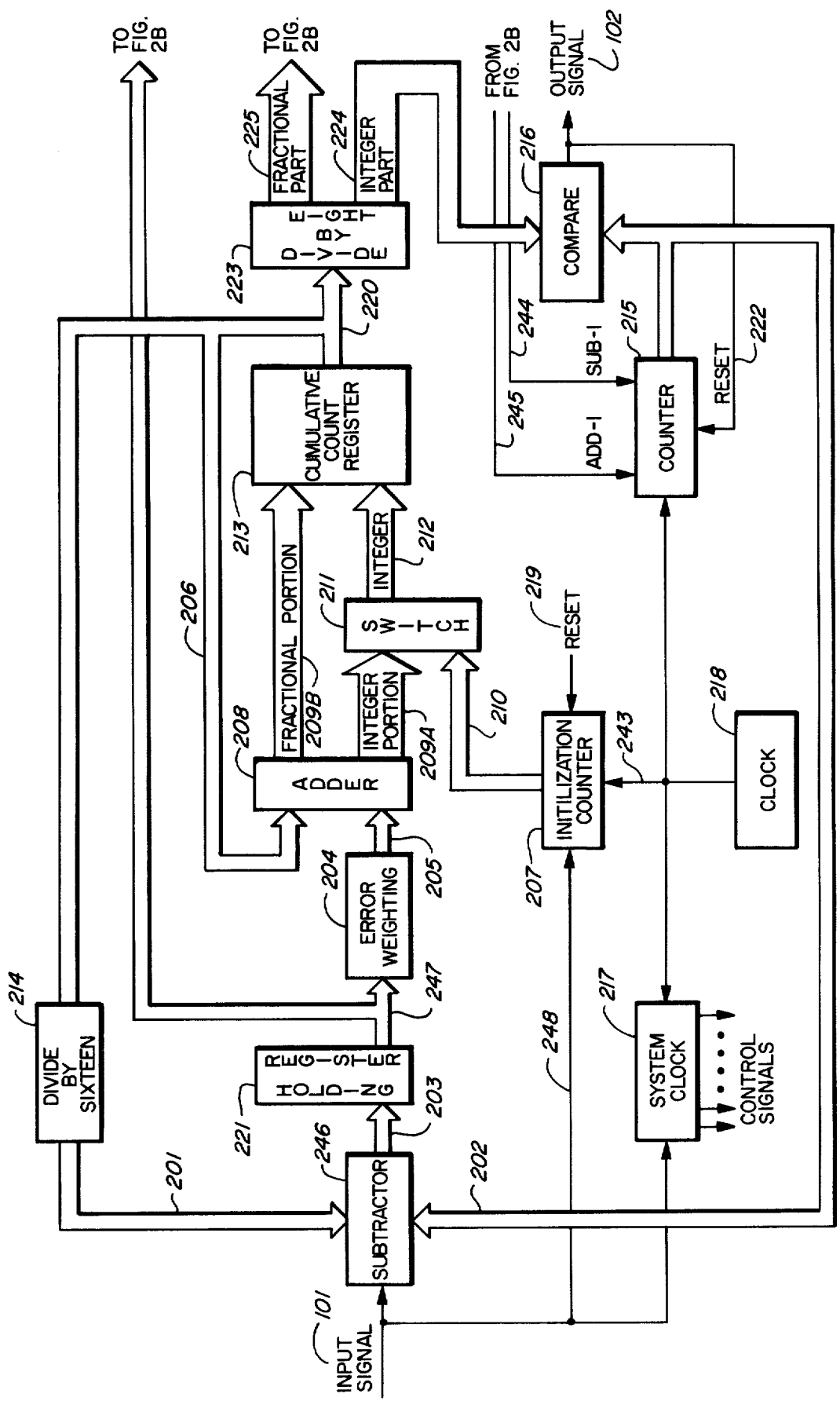

SYSTEM CLOCK

TIMING SIGNALS

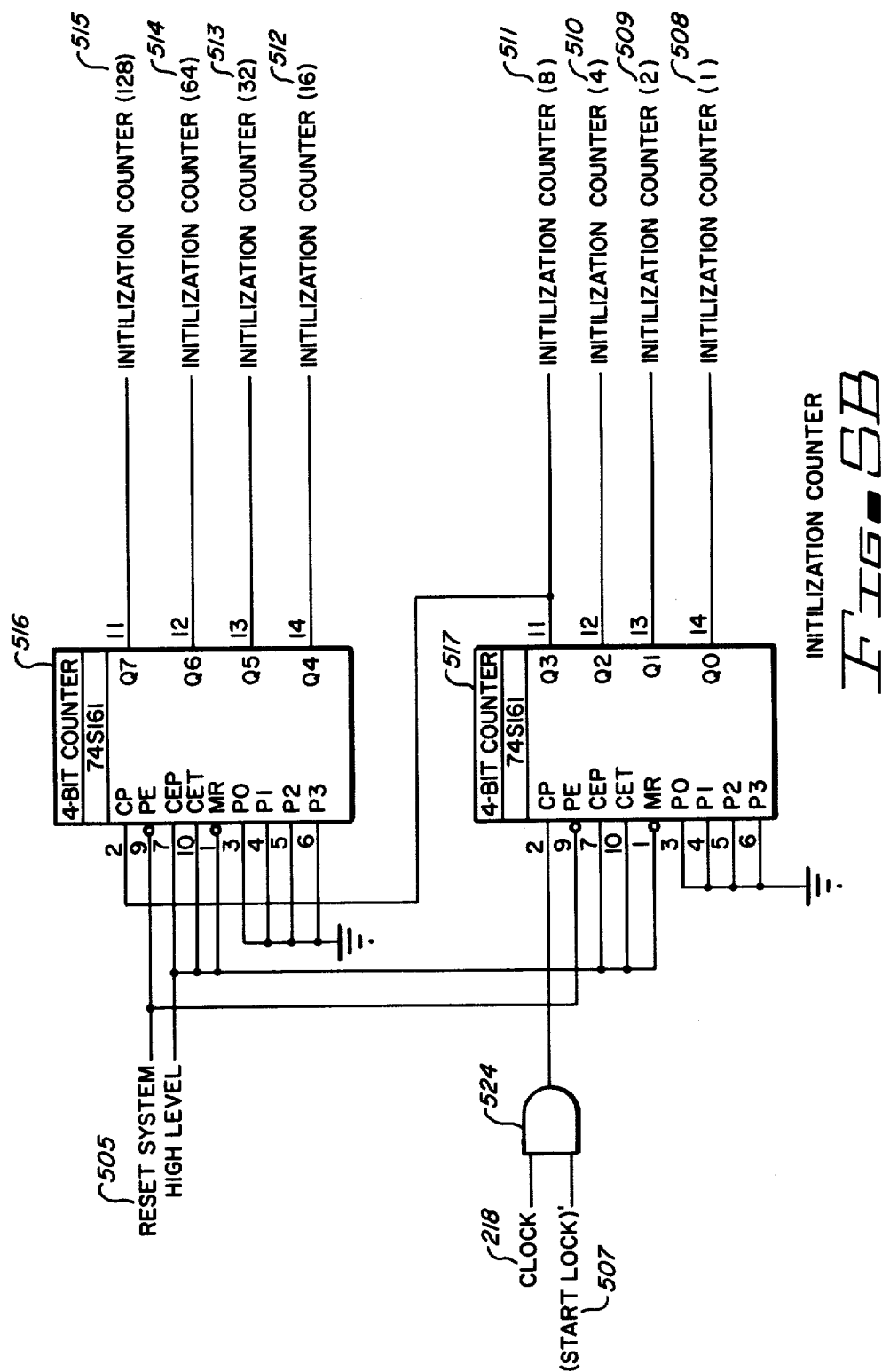

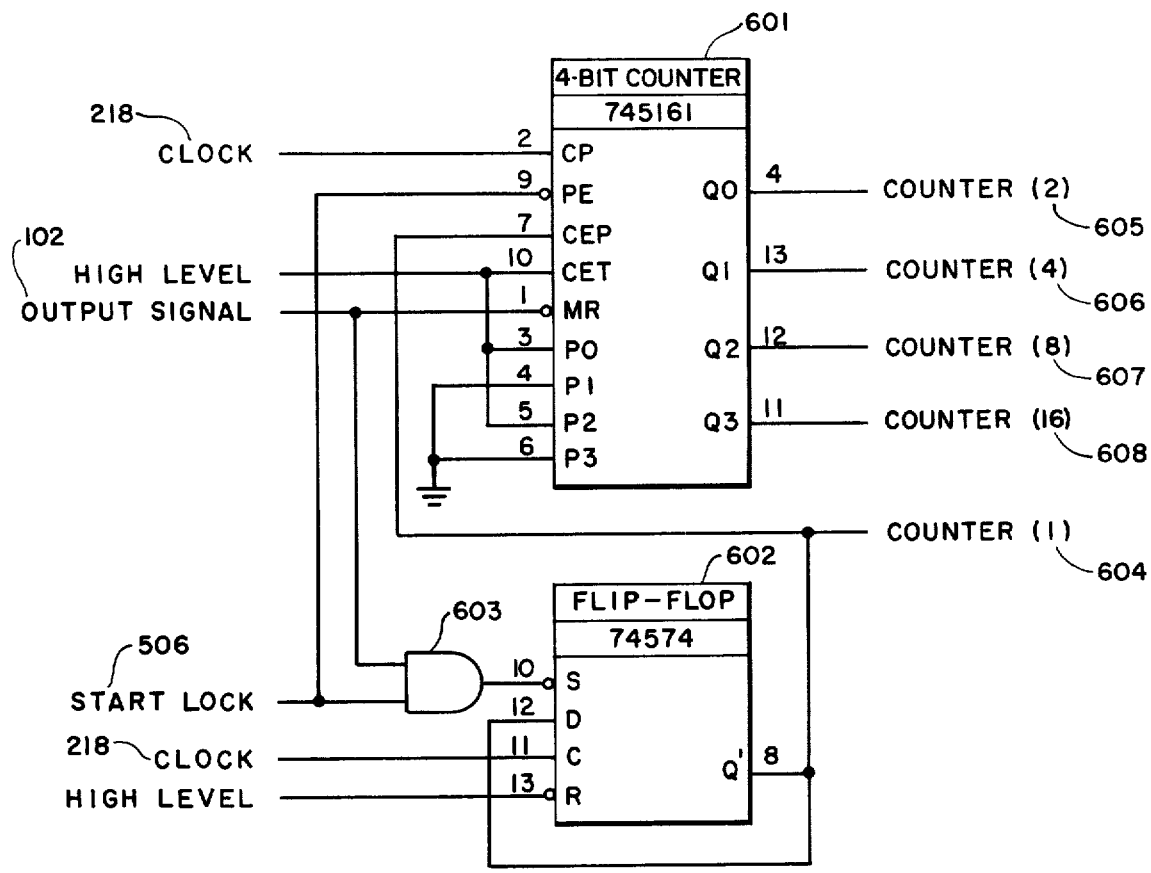
F I G. 6
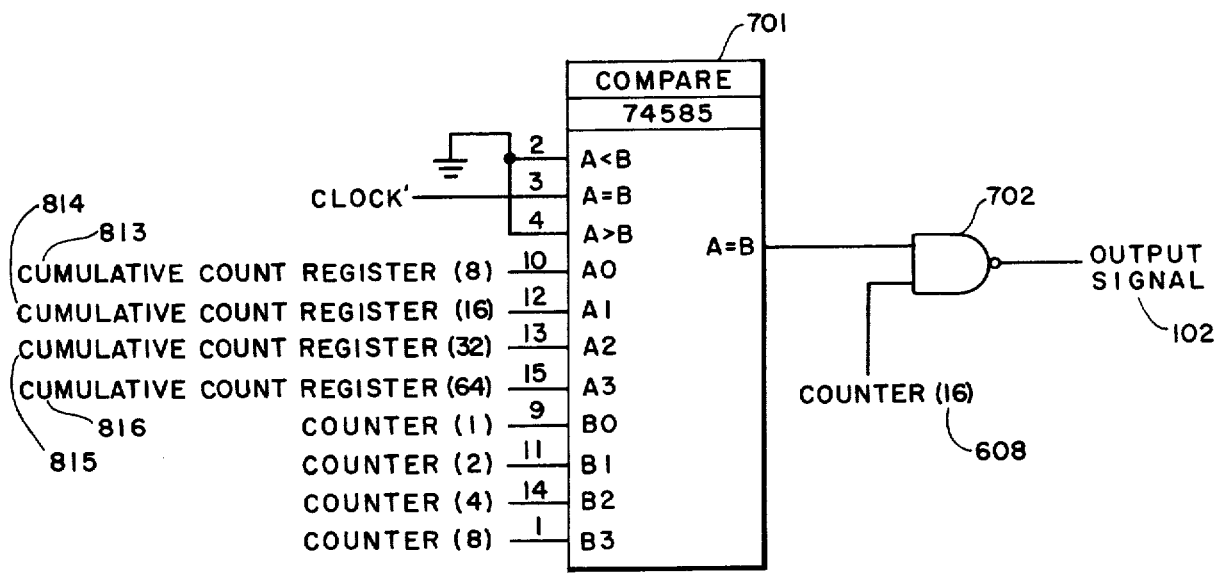
F I G. 7

ADDER 208 AND ERROR WEIGHTING 204

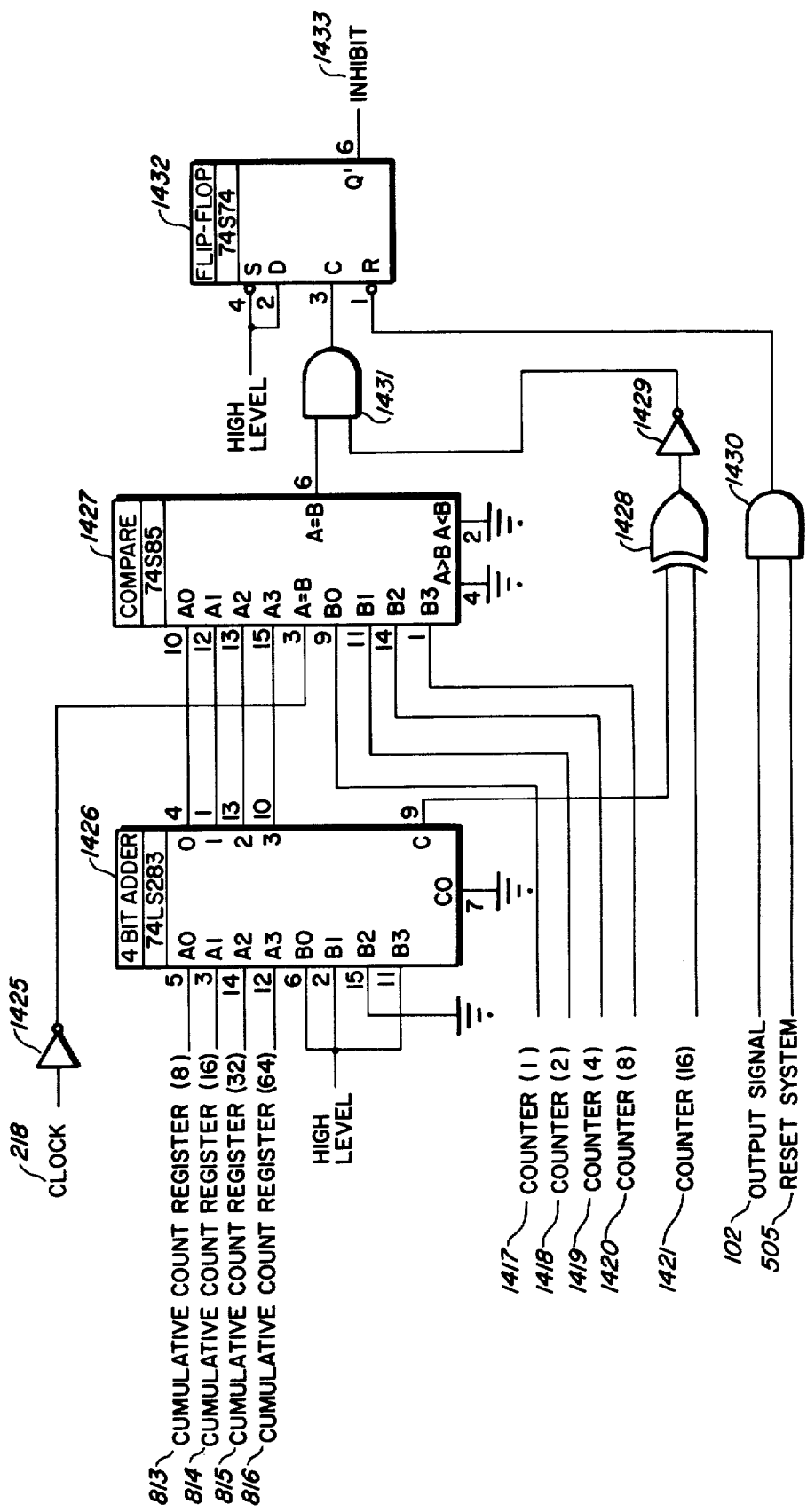
FIG_14B

SHORT TERM RESPONSE ENHANCEMENT FOR DIGITAL PHASE-LOCKED LOOP

CROSS REFERENCE TO RELATED APPLICATIONS

Application Ser. No. 251,845, filed Apr. 7, 1981, entitled DIGITAL PHASE-LOCKED LOOP by David R. Baldwin and Nicholas S. Lemak, and application Ser. No. 251,805, filed Apr. 7, 1981, now U.S. Pat. No. 4,369,991, entitled LONG TERM RESPONSE ENHANCEMENT FOR DIGITAL PHASE-LOCKED LOOP by David R. Baldwin and Nicholas S. Lemak.

BACKGROUND OF INVENTION

1. Field of Invention

This invention relates to electronic circuits using phase-locked loops, and more particularly to a short term response enhancement for a digital phase-locked loop.

2. Description of Prior Art

A phase-locked loop is a device which produces an output signal at a frequency identical to and in phase with a signal supplied as an input thereto. As the input signal changes in frequency, the output signal will likewise change in frequency in such a manner to maintain a zero difference in phase between the input and output signals.

In the past, phase-locked loops have been implemented using analog techniques. A basic analog phase-locked loop consists of three fundamental parts: a Phase Detector, a Filter, and a Voltage-Controlled Oscillator.

The Phase Detector is a device which detects the difference in phase between two input signals, and produces an output signal proportional to the amount of said phase difference. In a phase-locked loop, the two inputs to the Phase Detector are the Input Signal to the phase-locked loop, and the Output Signal of the phase-locked loop from a Voltage-Controlled Oscillator. The Output Signal from the Phase Detector is an analog signal, the magnitude of which is representative of the amount of phase difference between the two input signals thereto, hereinafter referred to as an error signal.

A Filter serves to remove any high-frequency components from the error signal produced by the Phase Detector, and provides a slowly varying Output Signal which is representative of the average error in phase between the Output Signal and the Input Signal.

A Voltage-Controlled Oscillator is an oscillator whose frequency is controlled by an Input Voltage. In a phase-locked loop, the Input Voltage to the Voltage-Controlled Oscillator is the output of the Filter, and is an error signal representative of the difference in phase between the Input Signal and the Output Signal. Due to the feedback of the Output Signal to one input of the Phase Detector, the frequency of the Voltage-Controlled Oscillator is adjusted by Input Voltage to produce agreement in phase between the Input Signal and the Output Signal.

While prior art implementations of phase-locked loops have employed varying amounts of digital techniques, analog techniques have always been present, to some extent; most notably in the filter section of the phase-locked loop.

The present invention is distinguishable from such prior art in that the implementation of the phase-locked loop is accomplished using entirely digital techniques.

SUMMARY OF INVENTION

The response of the output of an analog phase-locked loop to a change in the phase of an input signal thereto is observed to be somewhat exponential in nature; similar to the voltage waveform appearing across a capacitor charging from a first voltage to a second voltage. In general terms, the response of a phase-locked loop to a change in phase on the input signal can be considered to be composed of two parts: a short term response which is responsible for a major change in the phase of the output signal over a relatively short period of time; and a long term response which is responsible for a minor change in the phase of the output signal over a relatively long period of time.

The present invention is directed to modifying the response of a digital phase-locked loop by incorporating a short term response component in the output characteristics of a digital phase-locked loop. In particular, the short term response will produce a major change in the phase of the output signal over a relatively short period of time in response to a change in the phase of the input signal.

A primary object of the present invention is to provide for a response from a digital phase-locked loop similar to the response observed from an analog phase-locked loop.

A further object of the present invention is to modify the response from a digital phase-locked loop such that a change in the phase on the input signal will result in a change in the phase of the output signal of a major portion of the percent of phase change experienced on the input signal over a relatively short period of time.

A still further object of the present invention is to provide for a short term response enhancement for a digital phase-locked loop using strictly digital techniques.

The various novel features of this invention, along with the foregoing and other objects, as well as the invention itself both as to its organization and method of operation, may be more fully understood from the following description of a disclosed embodiment when read in conjunction with the accompanying drawings.

DESCRIPTION OF DRAWINGS

FIGS. 2A and 2B taken together are a block diagram of a digital phase-locked loop with a short term response enhancement.

FIG. 2A illustrates the basic block diagram of a digital phase-locked loop, disregarding Fractional Part 225 and ADD-1 245 and SUB-1 244.

FIG. 2B is a block diagram of the short term response enhancement for a digital phase-locked loop.

FIGS. 5A and 5B illustrate the implementation of Initialization Counter 207 shown in FIG. 2A.

FIG. 6 illustrates the implementation of Counter 215 shown in FIG. 2A.

FIG. 7 illustrates the implementation of Compare 216 shown in FIG. 2A.

FIG. 14, which comprises FIGS. 14A and 14B, illustrates the implementation of Counter 215 shown in FIG. 2A when used in conjunction with the present invention.

DETAILED DESCRIPTION OF PREFERRED EMBODIMENT

Figure 1A:
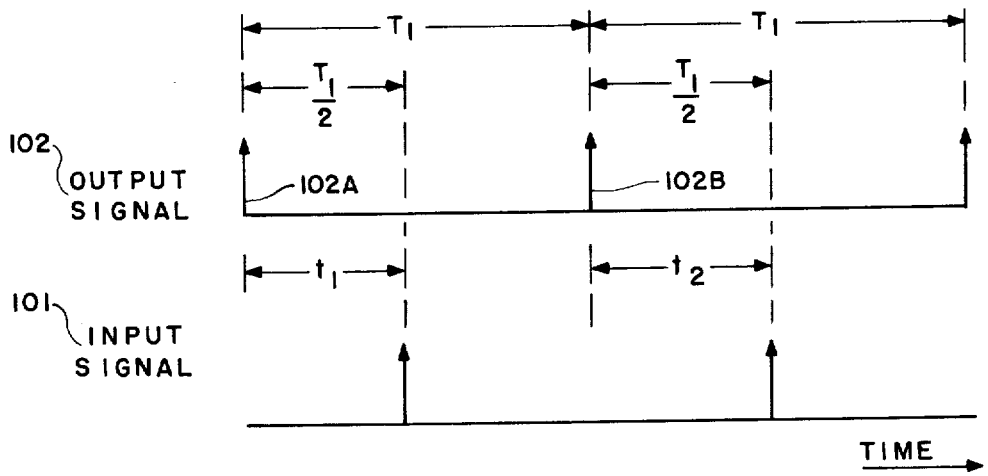
FIGS. 1A and 1B are timing diagrams illustrating the time relationships between the Input and Output signals for a digital phase-locked loop.
Figure 1B:
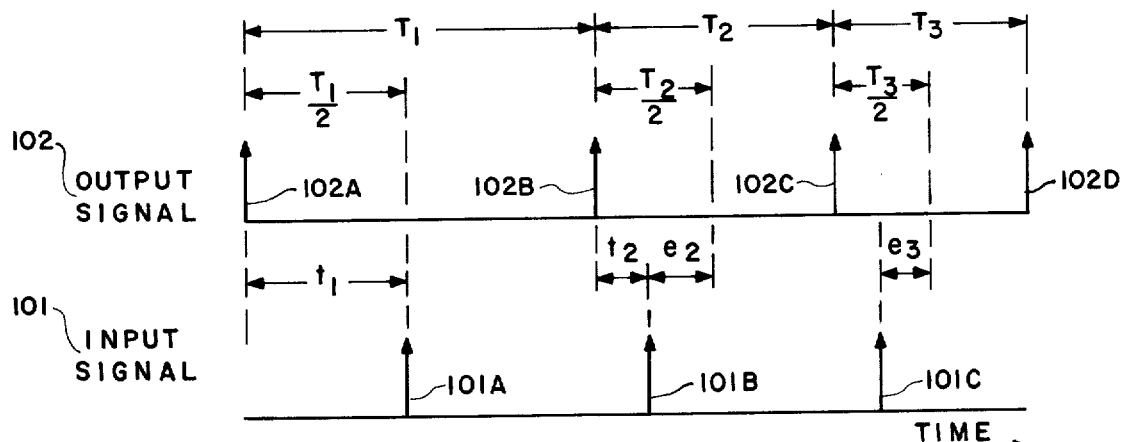

FIGS. 1A and 1B summarize operation of a digital phase-locked loop in terms of the time relationships between the Output Signal 102 and Input Signal 101, as a result of a change in the phase of the Input Signal 101.

It should be understood in connection with FIGS. 1A and 1B that the indicated Input Signal 101 and Output Signal 102 are representative of the occurrence of a predefined event, such as a high-to-low transition, a low-to-high transition, the occurrence of an impulse signal, etc. The precise nature of the event is a matter of definition, and will depend upon the particular application of the present invention. Hereinafter, the occurrence of said event on the Input Signal 101 will be referred to as an Input Event, and the occurrence of an output on Output Signal 102 as an Output Event.

From FIG. 1A which illustrates the time relationship between the Input Event 101 and the Output Event 102 for the case when the Input Event 101 and Output Event 102 agree in frequency and in phase, it is observed that the Output Event will occur at a point midway between successive Input Events. In the digital phase-locked loop, this time relationship between Input and Output Events is defined to be indicative of a zero phase difference between the Input Signal 101 and the Output Signal 102. Consequently, the existence of a non-zero phase difference between the Input Event 101 and the Output Event 102 will be indicated by the occurrence of an Output Event at a point other than midway between successive Input Events.

FIG. 1B illustrates the effect on the Output Event 102 when the Input Event 101 undergoes a change in phase. It will be observed from FIG. 1B that the Input Event 101A occurs on Input Signal 101 at time interval $t_1$ after the occurrence of Output Event 102A on Output Signal 102. For the case where the Input Event 101 and the Output Event 102 agree in both frequency and phase, $t_1 = T_1/2$. Thereafter, Input Event 101 undergoes a change in phase with the occurrence of the next Input Event 101B on Input Signal 101. Input Event 101B occurs an amount of time $t_2$ after the occurrence of Output Event 102B. Due to the change in phase of Input Event 101 by the occurrence of Input Event 101B earlier than expected, time period $t_2$ will not equal one-half of the expected time between Output Events 102B and 102C had there been no change in the phase of the Input Event on Input Signal 101; in particular there now exists an error $e_2$ equal to one-half the difference in the expected time between the Output Events 102B and 102C, had there been no change in phase on Input Signal 101, and the time $t_2$ between Output Event 102B and Input Event 101B, i.e., $e_2 = (T_1/2) - t_2$. It will be observed that as a result of Input Event 101B occurring earlier than expected, Output Event 102C, from the digital phase-locked loop, will now necessarily occur earlier following 102B than 102B occurred following 102A, i.e., $T_2$ will be less than $T_1$, as the phase-locked loop is now in the process of adjusting the frequency of the Output Event on Output Signal 102 to its new frequency of operation, in response to the change in the frequency of the Input Event on Input Signal 101, so that the phase of the Output Event 102 will agree with the phase of the Input Event 101.

It is further observed during the next sequence of Input Event 101C an Output Event 102D, that Output Event 102D will again occur earlier than Output Event 102C, i.e., $T_3$ will be less than $T_2$, such that error $e_3$ will be less than error $e_2$. This sequence will continue until the amount of error, e, approaches zero, indicating agreement in both frequency and phase between the Input Signal 101 and Output Signal 102.

Figure 2B:
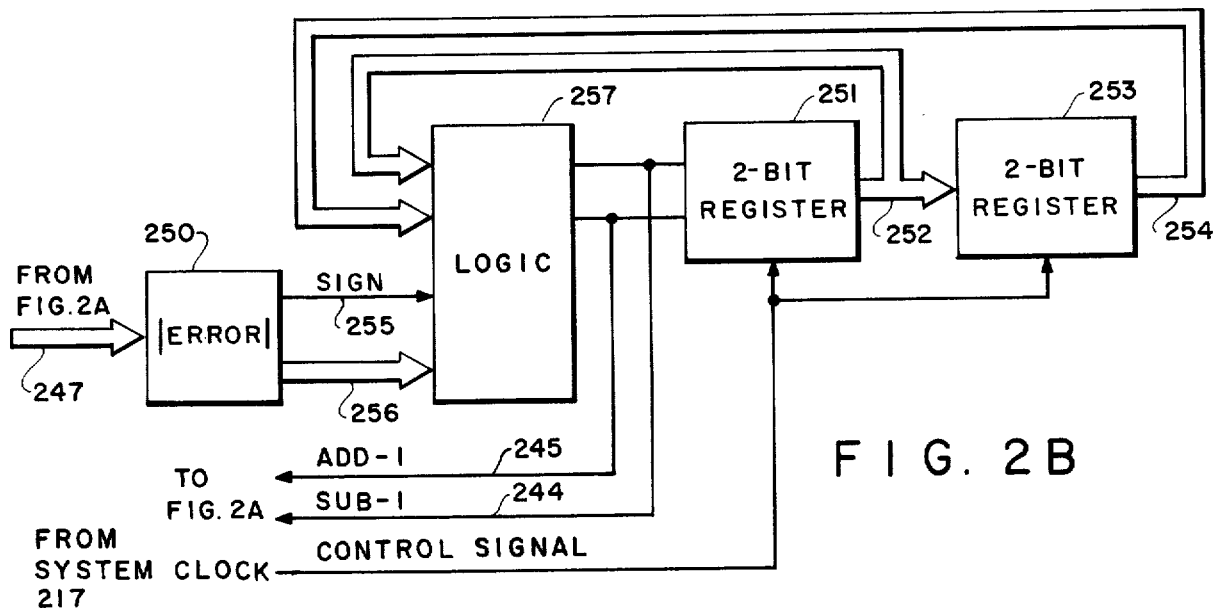

FIGS. 2A and 2B together are a more detailed functional block diagram of an implementation of the present invention. It is to be understood that each of the functional blocks represented in FIGS. 2A and 2B perform a function as hereinafter described, and may or may not require hardware logic elements for their individual implementation, as will subsequently become apparent.

The following description of an embodiment of the present invention will begin by first describing the operation of an implementation of a digital phase-locked loop, as illustrated in FIG. 2A, disregarding Fractional Part 225, signal 247 from Holding Register 221 to FIG. 2B and ADD-1 245 and SUB-1 244 from FIG. 2B. Thereafter, the implementation of the present invention, a short term response enhancement for a digital phase-locked loop will be discussed, when signal 247 from Holding Register 221 will connect to /ERROR/ 250 shown in FIG. 2B, and ADD-1 245 and SUB-1 244 shown in FIG. 2B will connect to Counter 215 shown in FIG. 2A.

The following discussion of the operation of a digital phase-locked loop will begin by a description of the functions performed by each of the functional blocks appearing in FIG. 2A, followed by a discussion of how the functional blocks operate together to perform the function of a digital phase-locked loop. Thereafter the implementation of each block will be given, concluding with a discussion of how the implementation of the digital phase-locked loop operates.

Subtractor 246 is a digital subtractor which, upon the occurrence of an Input Event on Input Signal 101, will perform the digital subtraction of a subtrahend 201, i.e., the contents of Cumulative Count Register 213 after division of the contents thereof by sixteen by Divide-by-Sixteen 214, from a minuend 202, i.e., the contents of Counter 215, to form a difference 203, hereinafter referred to as an error signal.

Holding Register 221 is a register which temporarily stores the results 203 of Subtractor 246.

Error Weighting 204 applies a numeric weighting factor to the digitally formatted error signal 247, producing a numeric result 205, in a digital format.

Adder 208 is a digital adder which performs the addition of the error signal 205 after appropriate weighting from Error Weighting 204 with the current contents 206 of Cumulative Count Register 213 to produce a sum 209 composed of an integer portion 209A and a fractional portion 209B.

Initialization Counter 207 is a counter which is reset by a momentary low signal on Reset 219, and thereafter counts the number of pulses 243 generated by Clock 218 which occur during the time required for eight Input Events to occur on Input Signal 101.

Switch 211 is a digital switch which selects either the integer portion 209A of the sum produced by Adder 208 or the contents 210 of Initialization Counter 207 to be supplied 212 to Cumulative Count Register 213.

Cumulative Count Register 213 is a register which contains a number which represents the number of pulses generated by Clock 218 which are expected to occur in the time required for eight Input Events to occur on Input Signal 101.

Divide-by-Sixteen 214 provides the functions of dividing the contents of Cumulative Count Register 213 by sixteen.

Divide-by-Eight 223 divides the current contents 220 of Cumulative Count Register 213 by eight, and presents the integer part of the results 224 to Compare 216.

Counter 215 is a counter which counts the number of pulses generated by Clock 218 in a given time period, and is reset by the occurrence of an Output Event on Output Signal 102 on line 222.

Compare 216 is a digital comparator which compares the numeric contents of Counter 215 with the numeric contents of Cumulative Count Register 213 after division of the contents thereof by eight by Divide-by-Eight 223, and generates Output Signal 102 when the two numeric values agree.

Clock 218 is a source of pulses regularly spaced in time.

System Clock 217 is a logic network which generates a plurality of pulses in a particular sequence which are used for control signals within the digital phase-locked loop.

The above combination of functional elements shown in FIG. 2A operate together to perform the function of a digital phase-locked loop in the following manner.

Initially the digital phase-locked loop must sample the frequency of the Input Signal 101 to determine the average frequency thereof. This is accomplished as follows.

Upon application of Reset Signal 219, to Initialization Counter 207, Initialization Counter 207 begins counting pulses generated by Clock 218 by 243 immediately following the first Input Event which occurs on Input Signal 101 by signal line 248. Initialization Counter 207 continues to count said pulses generated by Clock 218 until a total of eight Input Events have occurred on Input Signal 101.

During the initialization period, Switch 211 connects the contents of Initialization Counter 207 to the inputs of Cumulative Count Register 213, and shortly after the occurrence of the ninth Input Event on Input Signal 101, the contents of Initialization Counter 207 are transferred to Cumulative Count Register 213. Immediately thereafter, Switch 211 changes so as to thereafter connect the integer output 209A of Adder 208 to Cumulative Count Register 213 for transfer of the integer output of said Adder 208 to Cumulative Count Register 213 at the appropriate time, as later described herein.

Simultaneously upon the occurrence of the ninth Input Event on Input Signal 101, Counter 215 begins counting pulses generated by Clock 218.

Compare 216 compares the contents of Counter 215 with the number present in Cumulative Count Register 213 after said number has been divided by eight by Divide-by-Eight 223. When the number present in Counter 215 is equal to the number present in Cumulative Count Register 213 after division of the contents thereof by eight by Divide-by-Eight 223, Compare 216 will generate an Output Event on Output Signal 102, which will also reset 222 Counter 215.

At this point it should be observed that the number present in Cumulative Count Register 213 was originally obtained from Initialization Counter 207 and represents the number of pulses generated by Clock 218 during the time required for eight Input Events to occur on Input Signal 101. Consequently, division of the number present in Cumulative Count Register 213 by eight will yield a number which represents the number of pulses from Clock 218 expected to occur between successive Input Events on Input Signal 101.

It should also be observed that since Counter 215 is reset 222 by the occurrence of an Output Event on Output Signal 102, Counter 215 begins counting pulses generated by Clock 218 immediately following the occurrence of said Output Event on Output Signal 102.

With the functional blocks of the Cumulative Count Register 213, Divide-by-Eight 223, Counter 215 and Compare 216 operating as above described, it will be observed that the Output Event on Output Signal 102 will occur when the number of pulses generated by Clock 218 as counted by Counter 215 equals the expected number of pulses generated by Clock 218 between successive Input Events as represented by the integer number stored in Cumulative Count Register 213 after division thereof by eight by Divide-by-Eight 223.

The number which was previously stored in Cumulative Count Register 213, which represents the number of pulses generated by Clock 218 during the interval of time required for eight Input Events to occur on Input Signal 101 is divided by sixteen by Divide-by-Sixteen 214 and supplied as the subtrahend input 201 to Subtractor 246. The Minuend Input 202 to Subtractor 246 is supplied from Counter 215.

Subtractor 246 subtracts a subtrahend 201, which is the current contents of Cumulative Count Register 213 after said contents have been divided by sixteen by Divide-by-Sixteen 214, from a minuend 202 which is the contents of Counter 215. The results of said subtraction will be transferred to Holding Register 221 at the occurrence of an Input Event on Input Signal 101.

Hence division of the contents of Cumulative Count Register 213 by sixteen will yield a number which represents the expected number of pulses generated by Clock 218 to have occurred when the next Input Event is expected to occur on Input Signal 101, from the occurrence of the last Output Event on Output Signal 102. However, Counter 215 is counting the number of pulses generated by Clock 218 which have occurred from the occurrence of the last Output Event on Output Signal 102. On the occurrence of the next Input Event on Input Signal 101, the difference between the number contained in the Cumulative Count Register 213, after division by sixteen by Divide-by Sixteen 214, and the number present in Counter 215 will indicate whether or not the Input Event on Input Signal 101 occurred when expected. In particular, if said Input Event did not occur when expected, the results of said subtraction will produce a non-zero result 203 which represents the number of pulses generated by Clock 218 by which said Input Event was displaced in time from the point at which it was expected. This number will be referred to herein as an Error Signal 203, and will, upon the occurrence of said Input Event on Input Signal 101 be transferred to Holding Register 221.

The Error Signal 247 from Holding Register 221 is appied to Error Weighting 204.

In dealing with error correction in phase-locked loops, it is generally not desirable to completely correct a phase error in an output signal. Rather, the preferred approach in practice is to correct a phase error in an output signal by only a portion of the measured phase error during each cycle of the output signal, so as to effect a relatively gradual change in the phase of said output signal. By so doing, the phase of the output signal is gradually adjusted to agree with the phase of the input signal.

In the digital phase-locked loop, it will be recalled that the Output Signal 102 is generated by Compare 216 when the number of pulses generated by Clock 218, as counted by Counter 215, equals the expected number of said pulses to occur, as obtained by comparing the contents of Counter 215 with the contents of Cumulative Count Register 213 after said contents thereof have been divided by eight by Divide-by-Eight 223. Consequently, it will be observed that by changing the contents of Cumulative Count Register 213, the point in time at which Compare 216 will generate an Output Event on Output Signal 102 can be altered. It is in this manner that the phase of Output Signal 102 is adjusted to agree with the phase of the Input Signal 101. This relationship can be expressed as $$Cn = Co + EK \quad (1)$$

where $Cn$ = expected number of pulses generated by Clock 218 to occur between successive Input Events on Input Signal 101, after correction for any measured change in phase on Input Signal 101.

$Co$ = expected number of pulses generated by Clock 218 to occur between successive Input Events on Input Signal 101.

$E$ = the number of pulses generated by Clock 218 by which the Input Event on Input Signal 101 was displaced in time from the point at which said Input Event was expected.

$K$ = the amount of correction, expressed as a percent, by which it is desired to adjust the phase of the Output Signal 102 in response to a change in phase on Input Signal 101.

It is observed from equation (1) that the value chosen for K will control the amount of time required by the present invention to respond to a change in the phase occurring on Input Signal 101. It will be particularly noted that the value assigned to K could be dynamically changed, based, for example, upon the measured error, or other factors dictated by the particular application. Such extensions or modifications of the present invention are contemplated by the present invention.

In the present embodiment, however, a static value for K has been chosen equal to 6.25%, based upon the fact that binary division by 16 is easily implemented, i.e., 1/16 = 0.0625.

Replacing K with 1/16 in equation (1) yields $$Cn = Co + E/16 \quad (2)$$

Multiplying each side of equation (2) by eight yields $$8Cn = 8(Co + E/16) \quad (3)$$

$$8Cn = 8Co + E/2 \quad (4)$$

It is observed that 8Co represents the number present in Cumulative Count Register 213. It follows from equation 4 that by dividing the measured error by two, and adding the resulting quotient to the current contents of Cumulative Count Register 213, the resulting sum will equal eight times the expected number of pulses to be generated by Clock 218 which are anticipated to occur between successive Input Events on Input Signal 101, to correct the phase of the Output Signal 102 by 6.25% of the measured error signal 203.

Consequently Error Weighting Factor 204 in the present embodiment provides for division by two of error signal 203, 247.

Adder 208, as indicated by equation (4), performs the addition of the measured error 203 after division by two, with the contents of Cumulative Count Register 213.

Thereafter, the number present in Cumulative Count Register 213 represents the number of pulses generated by Clock 218 exptected to occur between successive Input Events on Input Signal 101, to affect a phase adjustment of 6.25% of a measured error in phase occurring on the Input Signal 101, multiplied by eight.

While the above description of the operation of the present invention has been in general terms, practical considerations raised by implementing the present invention with hardware must be taken into consideration in the reduction to practice.

Due to the fact that Error Weighting 204 requires division of Error Signal 203 by two, clearly a numeric result is possible which may be composed of a whole number and a fractional part. Therefore, the number present in Cumulative Count Register 213 may be composed of a whole number plus a fractional part. Consequently, when the contents of Cumulative Count Register 213 are divided by eight by Divide-by-Eight 223 and presented 224 to Compare 216, any fractional part is not considered by Compare 216 in comparing the contents of Cumulative Count Register 213 after division by eight by Divide-by-Eight 223, with the contents of Counter 215. Likewise, during initialization, as only whole number pulses generated by Clock 218 are counted by Initialization Counter 207, necessarily only a whole number result is transferred by Switch 211 to Cumulative Count Register 213. Consequently Switch 211 switches only the whole number inputs to Cumulative Count Register 213 between Initialization Counter 207 and Adder 208. The fractional results from Adder 208 are therefore connected directly to the appropriate fractional portion of Cumulative Count Register 213 as discussed more fully hereinafter.

The implementation of the functional blocks of FIG. 2A will now be discussed.

The embodiment of the digital phase-locked loop was implemented using the following standard parts available from Texas Instruments Incorporated, P.O. Box 5012, Dallas, Tex. 75222.

| Part Type | Description |
|---|---|
| 74S00 | Quad 2-Input NAND |

-continued

| Part Type | Description |
| --- | --- |
| 74S04 | Hex Inverter |
| 74S08 | Quad 2-Input AND |
| 74S74 | Dual-D Flip Flop |
| 74S85 | 4-Bit Magnitude Comparator |
| 74S86 | Quadruple 2-Input Exclusive-OR Gate |
| 74S157 | 4-Bit 2-to-1 Select |
| 74S161 | 4-Bit Binary Counter |
| 74S175 | 4-Bit D-Register |
| 74S283 | 4-Bit Adder |

The reference data sheets on each of the above listed parts, as same appears in *The TTL Data Book*, Second Edition-1976, Texas Instruments Incorporated, is incorporated herein by reference.

Clock 218 can be implemented in numerous ways well known in the art. In the preferred embodiment of the present invention, the frequency at which Clock 218 was chosen to operate was twenty times the expected frequency of Input Signal 101.

Figure 4:
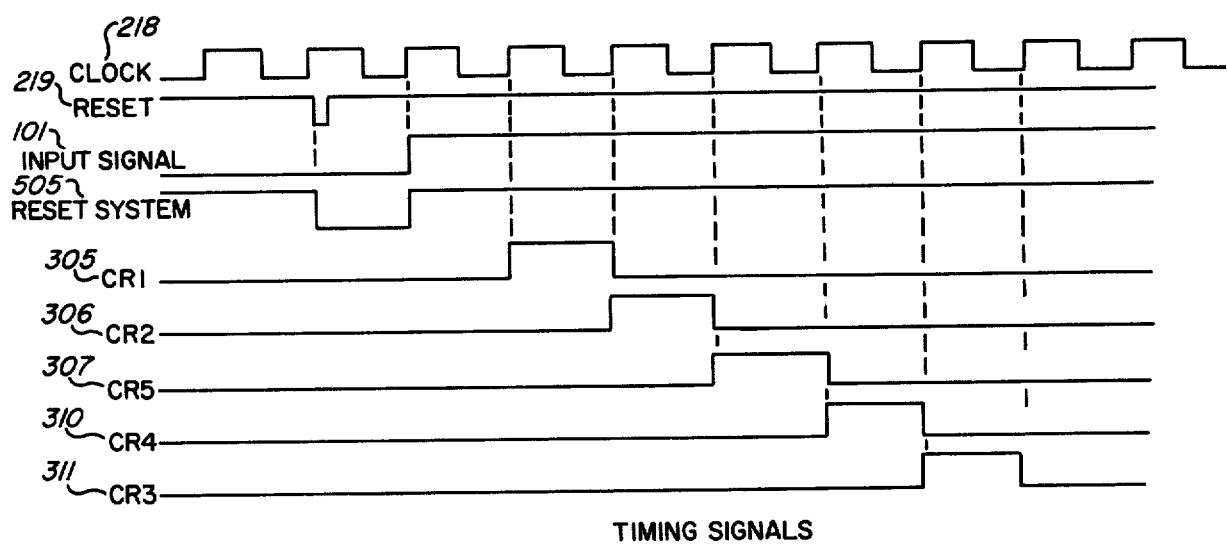
FIG. 4 illustrates the timing relationships of various signals in the present invention.
Figure 5A:
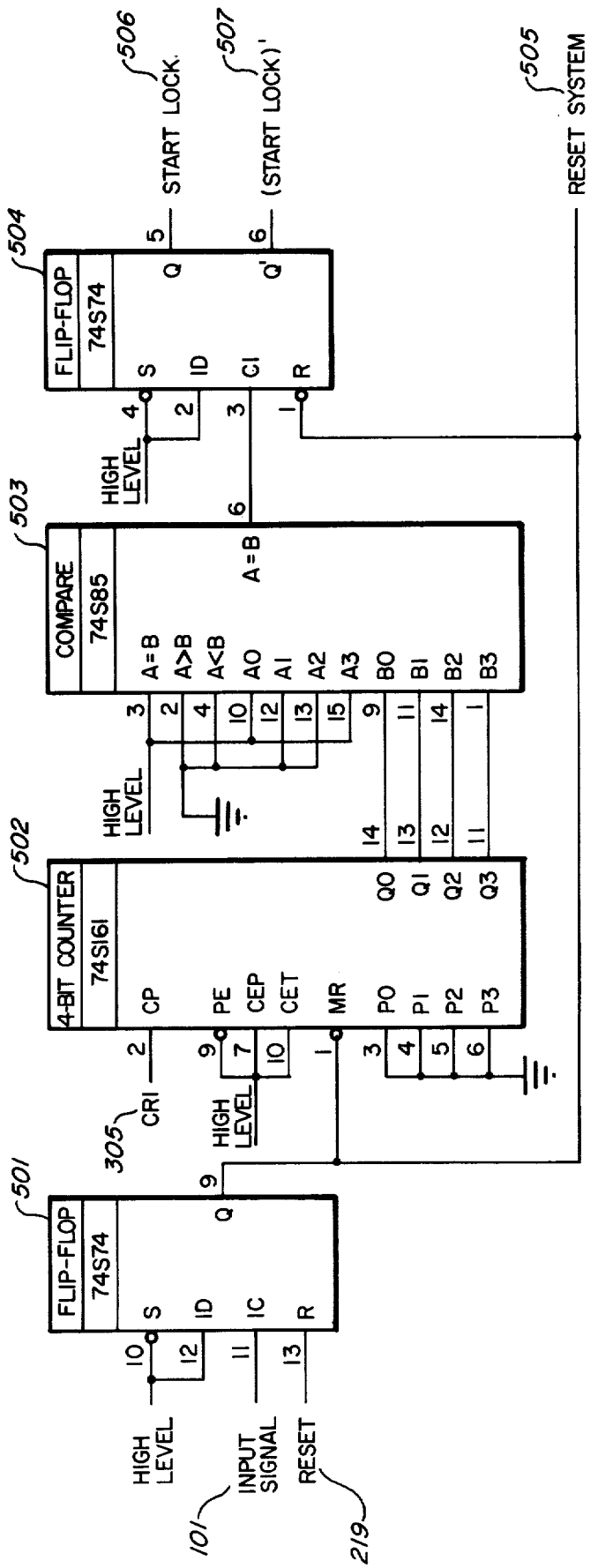

FIGS. 5A and 5B show the implementation of Initialization Counter 207. From FIG. 5A it will be observed that when Reset 219 goes low, Flip-Flop 501 is placed in the reset state, which results in its "Q" output, Reset-System 505, going low, which in turn clears 4-Bit Counter 502 and Flip-Flop 504 shown in FIG. 5A, Quad-D Flip-Flop 301, 316 shown, 316 in FIG. 3, 4-Bit Counters 516 and 517 shown in FIG. 5B, Flip-Flop 902 shown in FIG. 9 and 4-Bit Registers 1110 and 1111 shown in FIG. 11.

Figure 3:
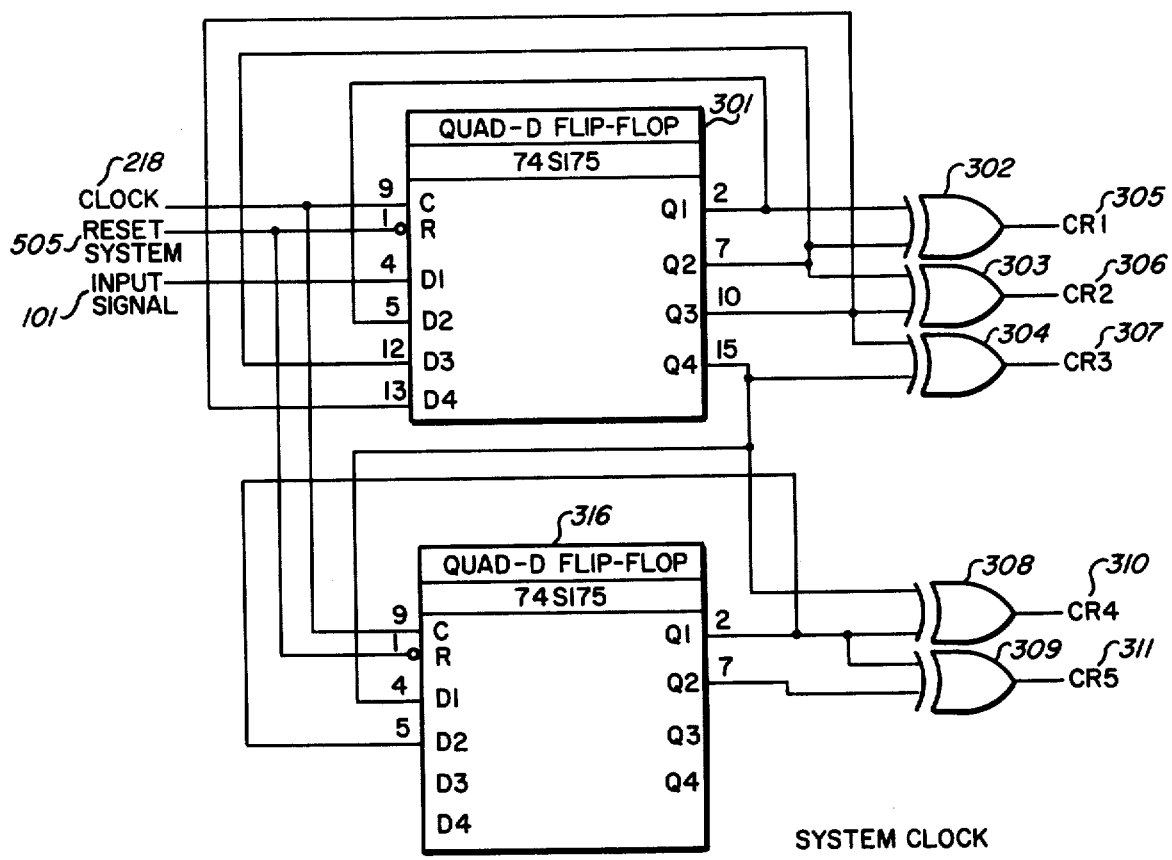
FIG. 3 illustrates the implementation of System Clock 217, shown in FIG. 2A.

Referring next to FIG. 3, the implementation of System Clock 217 is shown. It is observed that Quad-D Flip-Flops 301 and 316 and Exclusive-OR Gates 302, 303 304, 308 and 309 are connected in such a manner as to generate sequential control signals CR1 305, CR2 306, CR3 307, CR4 310 and CR5 311 in response to Reset System 505, Input Signal 101 and Clock 218 as shown in FIG. 4, as follows. With Flip-Flops 301 and 316 initially reset by Reset-System 505, outputs Q1, Q2, Q3 and Q4 of Flip-Flops 301 and 316 are all at logic zero. When Input Signal 101 changes to a high state, sequential control signals CR1 305, CR2 306, CR3 307, CR4 310 and CR5 311 will be subsequently generated upon the occurrence of sequential pulses on Clock 218. Control signals CR1 305, CR2 306, CR3 307, CR4 310 and CR5 311 are used for sequencing purposes within the present invention.

Returning now to FIGS. 5A and 5B, the operation of Initialization Counter 207 will now be discussed. Four-Bit Counter 502, Compare 503 and Flip-Flop 504 shown in FIG. 5A function together to count the occurrence of eight Input Events on Input Signal 101, during which time 4-Bit Counters 516 and 517 shown in FIG. 5B count the number of pulses generated by Clock 218 to determine the number of pulses generated by Clock 218 during the time required for eight Input Events to occur on Input Signal 101, as follows.

With Flip-Flop 504, shown in FIG. 5A, previously reset by Reset-System 505, (Start-Lock)' will be high, which, by gate 524 in FIG. 5B, will allow 4-Bit Counters 516 and 517 to count the number of pulses generated by Clock 218.

Referring next to FIG. 5A, 4-Bit Counter 502 counts the occurrences of CR1 305, and Compare 503 compares the count obtained by 4-Bit Counter 502 with the number nine as wired into pins A0, A1, A2 and A3 on said Compare 503. After the occurrence of eight Input Events on Input Signal 101, as indicated by the occurrence of a CR1 305 pulse for each of the Input Events on Input Signal 101, on the following Input Event, Compare 503 output A=B will change to a logic one which will result in Flip-Flop 504 "Q" output going high. Hence Start-Lock will change to a high state. This indicates completion of the initialization period during which time the present invention was sampling the frequency of the Input Signal 101 by counting the number of pulses generated by Clock 218 by 4-Bit Counters 516 and 517 shown in FIG. 5B during the time period required for eight Input Events as counted by 4-Bit Counter 502 shown in FIG. 5A to occur on Input Signal 101.

Next, the number of pulses generated by Clock 218 counted by 4-Bit Counters 516 and 517 shown in FIG. 5B, of Initialization Counter 207 will be transferred to the Cumulative Count Register 213 by way of Switch 211, as shown in FIG. 2A as follows.

Figure 8:
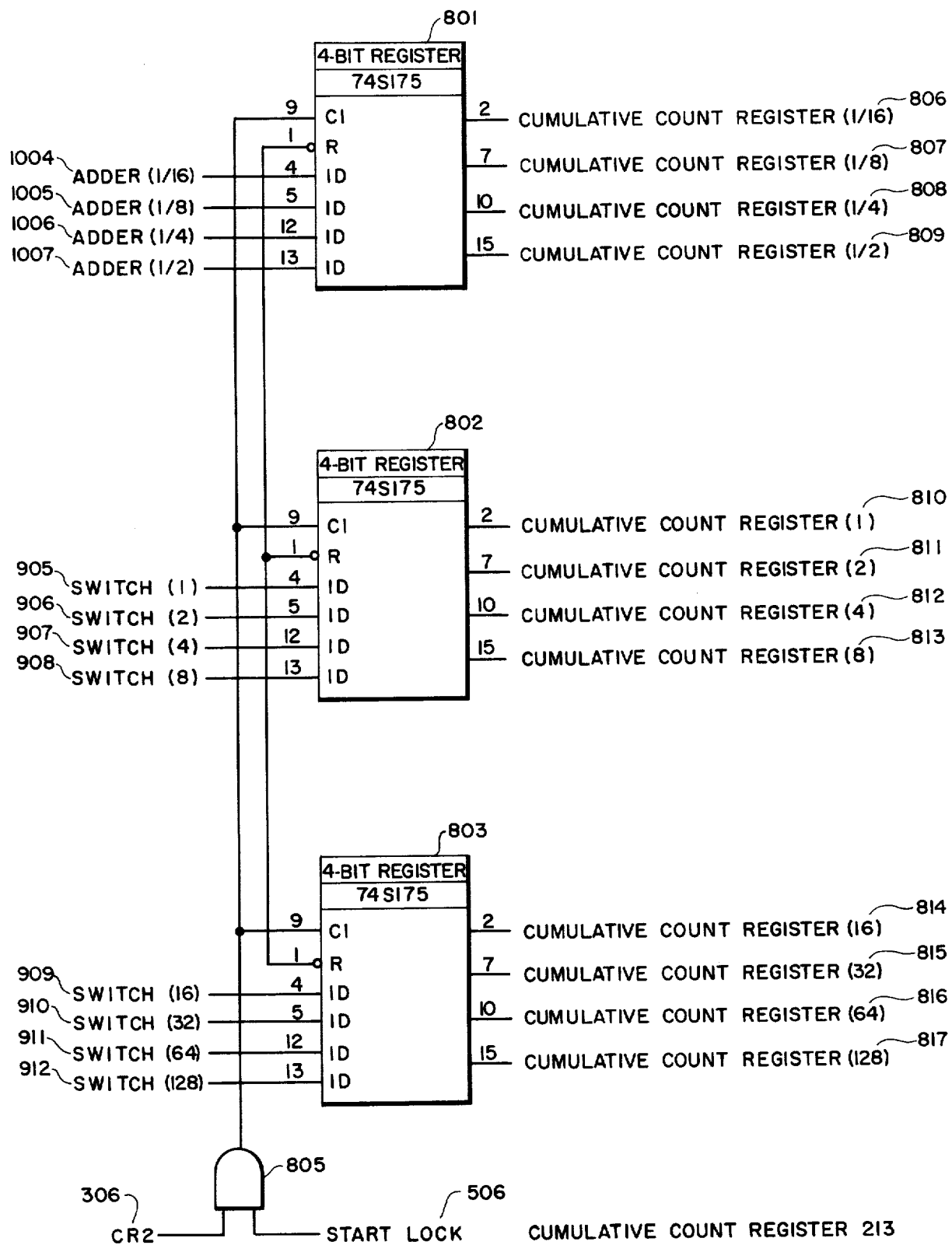
FIG. 8 illustrates the implementation of Cumulative Count Register 213 shown in FIG. 2A.
Figure 9:
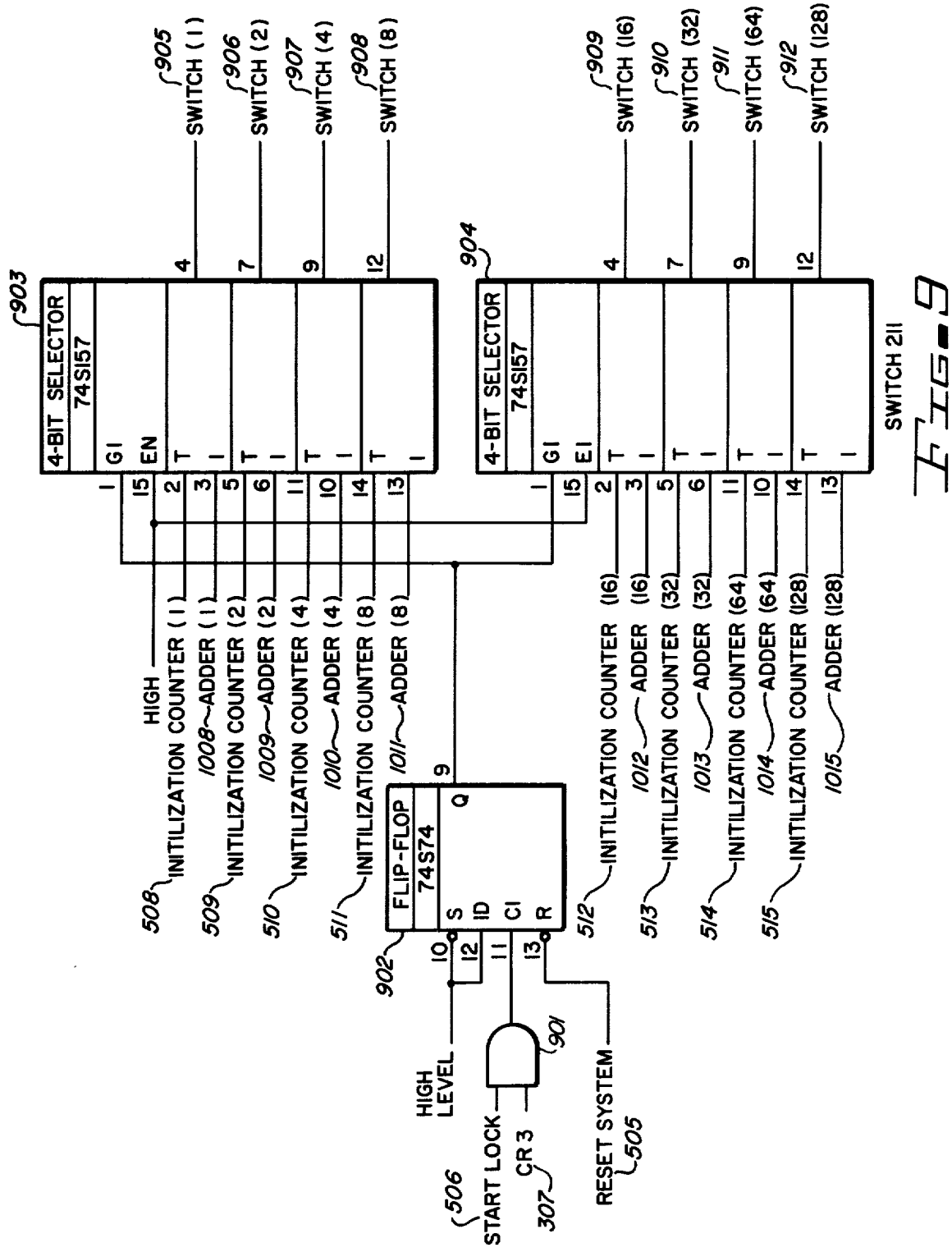
FIG. 9 illustrates the implementation of Switch 211 shown in FIG. 2A.

Referring to FIG. 9, with Flip-Flop 902 previously reset by Reset-System 505, the "Q" output of said flip-flop is low, which places 4-Bit Selectors 903 and 904 in a state wherein the outputs of Initialization Counter (1) 508 through Initialization Counter (128) 515 shown in FIG. 5B are connected through said Switch 211 as implemented by 4-Bit Selectors 903 and 904 on FIG. 9 to the corresponding outputs of said Selectors 903 and 904 to Switch (1) 905 through Switch (128) 912 which, referring to FIG. 8, thereby effectively connecting said outputs of Initialization Counter (1) 508 through Initialization Counter (128) 515 to the corresponding inputs of 4-Bit Registers 802 and 803 of Cumulative Count Register 213. Consequently, referring to FIG. 8 gate 805, since Start-Lock is high, on the occurrence of CR2 generated by the ninth Input Event on Input Signal 101, the contents of 4-Bit Counters 516 and 517 of FIG. 5B of Initialization Counter 207 will be transferred to 4-Bit Registers 802 and 803 of FIG. 8 of Cumulative Count Register 213 of FIG. 5.

At this point, the present invention has started operation from a reset condition, and has completed the portion of the initialization process wherein the frequency of Input Signal 101 has been effectively sampled by the counting of the number of pulses generated by Clock 218 during the time required for eight Input Events to occur on Input Signal 101.

The remaining task to be completed in the initialization process is to preload Counter 215 shown in FIG. 2A with the number ten.

The implementation of Counter 215 is given in FIG. 6. Four-Bit Counter 601 and Flip-Flop 602 together form Five-Bit Counter 215.

It is recalled that during the initialization period discussed above, the Start-Lock signal, shown in FIG. 5A is low, and changes to a high state at the completion of said initialization period. Consequently, referring to FIG. 6, during the initialization period, Flip-Flop 602 will remain in the set state due to the output of gate 603 being low. It will also be observed that the upper 4 bits of Counter 215 as implemented by 4-Bit Counter 601 will be preset by the high level present on preset input pins 3 and 5 and the low level present on pins 4 and 6 such that Counter 215 will be preset to a value of ten during the initialization period. Such presetting is required because, referring to FIG. 1A, it is recalled that the Output Signal 102 occurs at a point midway between successive Input Events on Input Signal 101, and as Counter 215 is, during operation normally reset on the occurrence of Output Signal 102, it will normally begin counting pulses generated by Clock 218 immediately after the occurrence of an Output Event on Output Signal 102. However, when the present invention is initially commencing operation after the initialization process has ended, Counter 215 will necessarily be counting pulses generated by Clock 218 after the occurrence of an Input Event on Input Signal 101. Consequently, it is necessary to preset Counter 215 with a number to reflect the difference in starting times for Counter 215. With the frequency for Clock 218 chosen to be twenty times the expected frequency of Input Signal 101, Counter 215 must therefore be preset with the number ten.

Consequently, directly following the initialization of the present invention by the counting of pulses generated by Clock 218 by Initialization Counter 207, and the transfer of said count to Cumulative Count Register 213, Start-Lock will go to a high state, enabling Counter 215, as implemented by 4-Bit Counter 601 and Flip-Flop 602 on FIG. 6 to begin counting pulses generated by Clock 218, from an initial value of ten.

Figure 11:
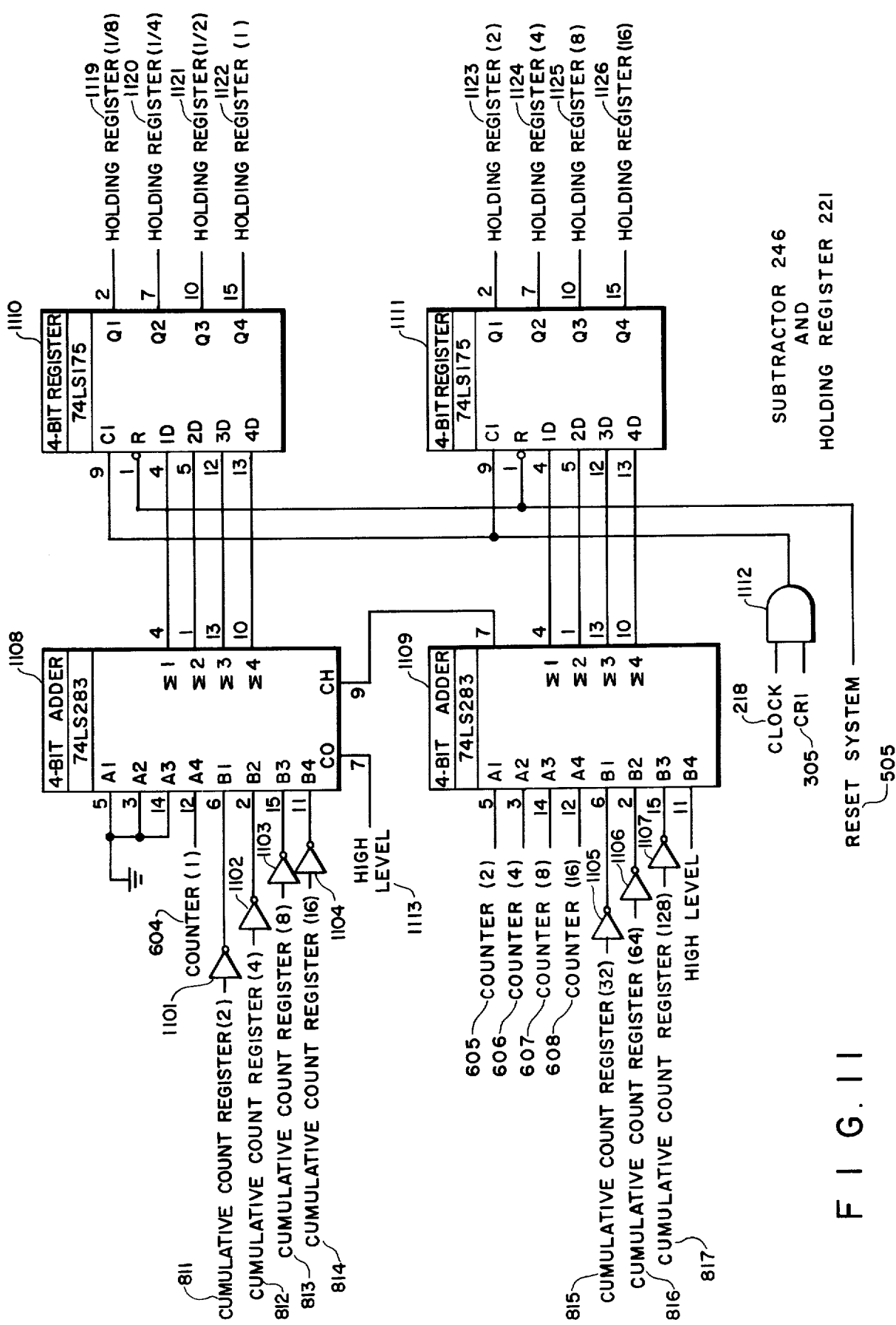
FIG. 11 illustrates the implementation of Subtractor 246 and Holding Register 221 shown in FIG. 2A.

FIG. 11 illustrates the implementation of Divide-by-Sixteen 214, Subtractor 246 and Holding Register 221 shown in FIG. 2A.

Subtractor 246 is implemented by 4-bit Adders 1108 and 1109, and Inverters 1101 through 1107. The subtraction is implemented by first forming the 2's complement of the subtrahend, i.e., the number present in Cumulative Count Register 213 on FIG. 3 after Divide-by-Sixteen 214, by Inverters 1101 through 1107 and the addition of a one to the carry input 1113 of 4-Bit Adder 1108, and thereafter adding the minuend, the number 202 present in Counter 215 on FIG. 2A, i.e., Counter (1) 604 through Counter (16) 608 shown in FIG. 6.

Divide-by-Sixteen 214 is implemented by the manner in which the signals representing the minuend and subtahend are connected to 4-Bit Adders 1108 and 1109. It is observed that the most significant bit of the 2's complement of the number present in Cumulative Count Register 213 is added to the most significant bit of the number present in Counter 215, i.e., Counter (16) 608, which results in the equivalence of dividing the number present in Cumulative Count Register 213 by sixteen prior to subtraction.

Holding Register 221 shown in FIG. 2A is implemented by 4-Bit Registers 1110 and 1111 shown in FIG. 11, to which the results of Subtractor 246 is transferred upon the occurrence of a Clock and CR1 signal to gate 1112.

As previously described, Error Weighting 204 shown in FIG. 2A functions to divide the number present in Holding Register 221 by two. As the result of this division by two signal 205 is added to the current contents of Cumulative Count Register 213 by Adder 208, said division by two can be implemented by the method by which the signals representing the contents of Holding Register 221 are connected to Adder 208.

Figure 10:
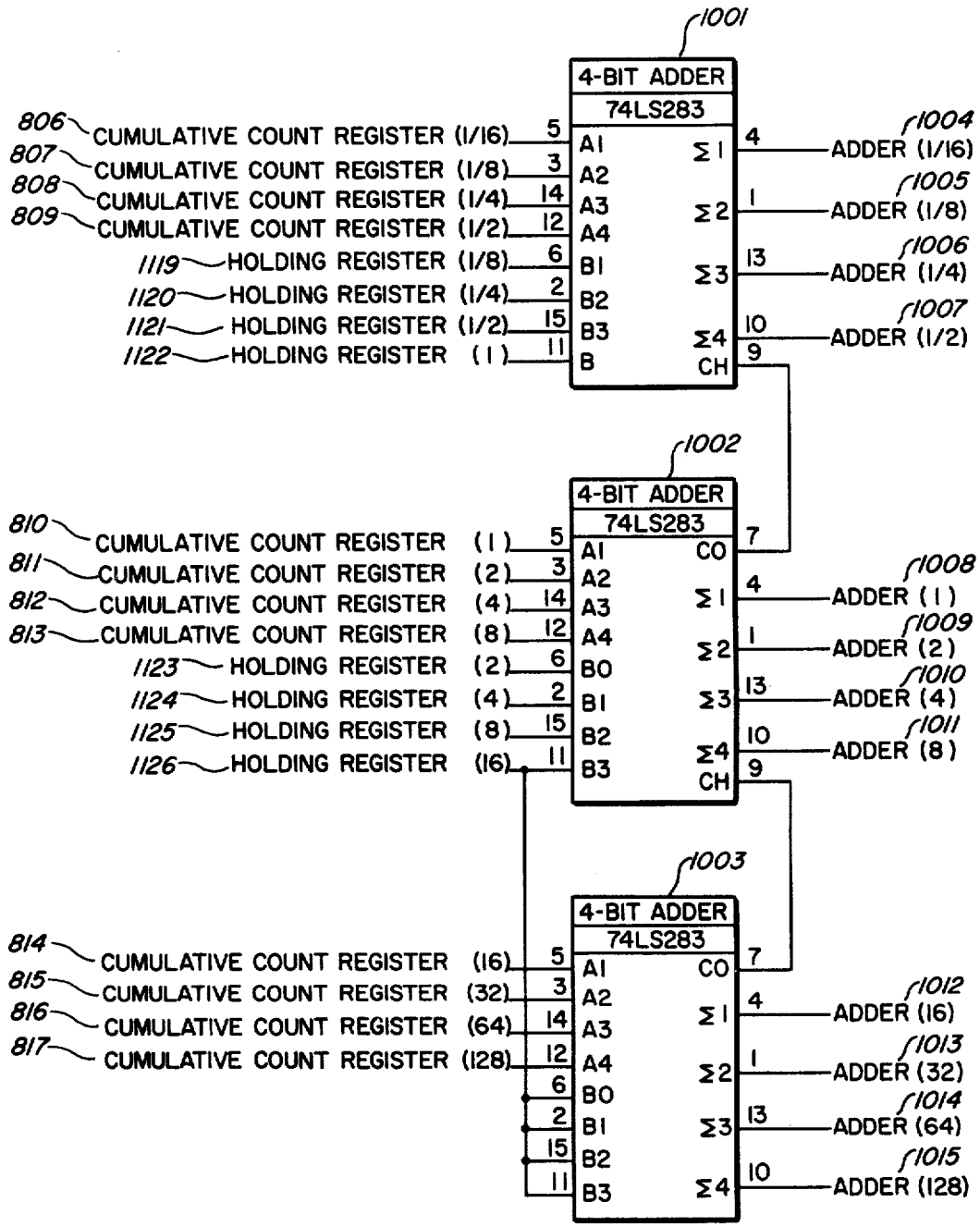
FIG. 10 illustrates the implementation of Adder 208 and Error Weighting 204 shown in FIG. 2A.

The implementation of Error Weighting 204 and Adder 208 is shown in FIG. 10. Four-Bit Adders 1001, 1002, and 1003 implement Adder 208 shown in FIG. 2A. It is observed that the signal representing the number present in Holding Register 221 have been shifted one binary position so as to implement division-by-two as above discussed, with Holding Register ($\frac{1}{8}$) 1119 through Holding Register (16) 1126 being connected in such a manner that the signals thereon appear in the outputs of 4-Bit Adder 1001 and 1002, Adder (1/16) 1004 through Adder (8) 1011 respectively. The most significant bit of the results of the subtraction by Subtractor 246 shown in FIG. 2A with implementation thereof shown in FIG. 11, is connected to the upper four bits of the implementation of Adder 208 shown in FIG. 2A with implementation shown in FIG. 10, so as to correctly reflect the sign as well as the status of the remaining upper bits on Error Signal 205 shown in FIG. 2A in the addition performed by 4-Bit Adders 1001 through 1003 shown in FIG. 10, by Holding Register (16) 1126 signal being also connected to 4-Bit Adder 1003 pins 6, 2, 15 and 11.

The contents of Adder 208 shown in FIG. 2A are then connected to Cumulative Count Register 213 by Switch 211. This is illustrated in FIGS. 8, 9, and 10. It is observed that the lower order four bits from Adder 208, i.e., Adder (1/16) 1004 through Adder ($\frac{1}{8}$) 1007, do not go through Switch 211, but connect directly to the lower order 4 bits of Cumulative Count Register 213, i.e., Adder (1/16) 1004 through Adder ($\frac{1}{8}$) 1007 to 4-Bit Register 801 shown in FIG. 8. This results from the fact that the said four lower bits from Adder 208 represent a fractional number, and as Initialization Counter 207 counts in whole numbers only, it is not necessary to be able to switch the lower four order bits from Initialization Counter 207 to Cumulative Count Register 213. The remaining bits of Adder 208, shown in FIG. 2A, and as implemented by Adder (1) 1008 through Adder (128) 1015 shown in FIG. 10 connect through Switch 211 shown in FIG. 2A as implemented in 4-Bit Selectors 903 and 904 shown in FIG. 9, and then to Cumulative Count Register 213 as implemented by 4-Bit Register 802 and 803 shown in FIG. 8.

The implementation of Divide-by-Eight 223 and Compare 216 shown in FIG. 2A is illustrated in FIG. 7. Compare 701 and NAND gate 702 together perform the said functions in the following manner.

The division function of Divide-by-Eight 223 is once again implemented by the manner in which the signals from Cumulative Count Register 213, i.e., Cumulative Count Register (64) through Cumulative Count Register (8) and the signals from Counter 215, i.e., Counter (1) 604 through Counter (16) 608 are connected to Compare 701 shown in FIG. 7. Referring to FIG. 7, it is observed the Cumulative Count Register (128) 817 is assumed to be a one, as it necessarily must be when Output Signal 102 is to be produced and consequently, NAND gate 702 ANDS Counter (16) 608 with the signal from Compare 701 indicating agreement between the numbers represented by the signal present on Counter (1) 604 through Counter (8) 607 and the number represented by the signals present on Cumulative Count Register (8) 813 through Cumulative Count Register (64) 816.

Upon the occurrence of Output Signal 102, Counter 215 shown in FIG. 2A as implemented by 4-Bit Counter 601 and Flip-Flop 602 shown in FIG. 6 is reset. At this point, the process is repeated, with Counter 215 shown in FIG. 2A immediately beginning to again start counting the occurrence of pulses generated by Clock 218.

Figure 14A:
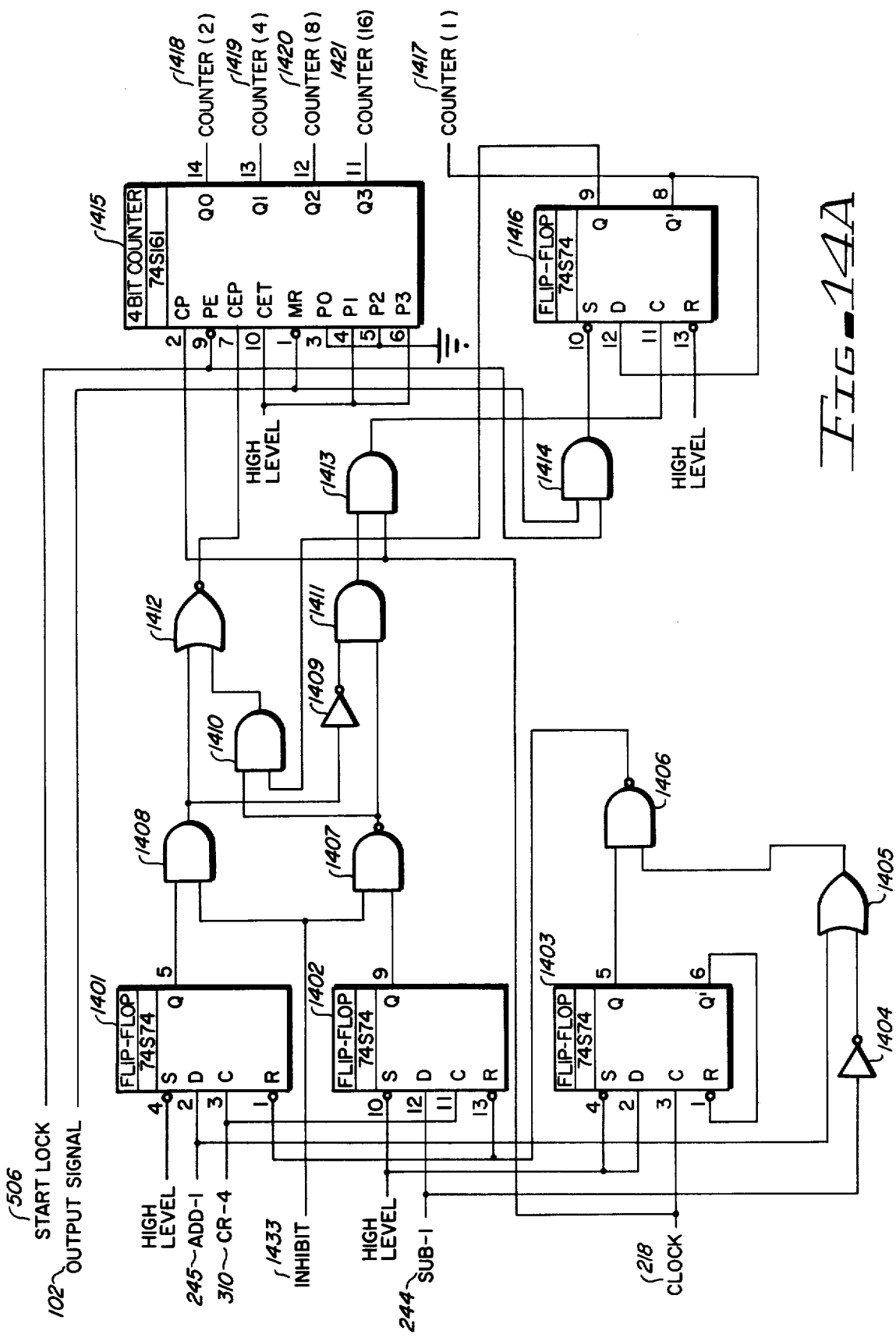

The basic response of the described digital phase-locked loop is modified by the present invention of a short term response enhancement, by connecting the output 247 of Holding Register 221 shown in FIG. 2A to /ERROR/ 250 shown in FIG. 2B, and connecting ADD-1 245 and SUB-1 244 shown in FIG. 2B to Counter 215 shown in FIG. 2A, as implemented in FIGS. 14A and 14B.

From the foregoing discussion of the operation of a digital phase-locked loop, it is observed that the Output Signal 102 is produced upon the occurrence of agreement between the number resulting from dividing the contents of Cumulative Count Register 213 by eight by Divide-by-Eight 223 and the count in Counter 215. Consequently, the time at which Output Signal 102 will occur can be altered by altering the counting sequence of Counter 215. In particular, if, during a sequence of counting, a count is subtracted from the count as performed by Counter 215, the time required for the number present in Counter 215 to agree with the contents of Cumulative Count Register 213 after division thereof by eight by Divide-by-Eight 223 will be increased, resulting in the occurrence of Output Signal 102 being thereby delayed. Likewise, if, during a sequence of counting, a count is added to the count as performed by Counter 215, the time required for the number present in Counter 215 to agree with the contents of Cumulative Count Register 213 after division thereof by eight by Divide-by-Eight 223 will be decreased, resulting in the occurrence of Output Signal 102 earlier than would otherwise occur.

The present invention, based upon the sign and the magnitude of the error produced by Subtractor 246, as well as the past history of the count modification of Counter 215 by the present invention, either adds one, zero, or subtracts one from the count sequence of Counter 215.

The block diagram of the present invention is given in FIG. 2B, with the various blocks therein functioning as follows.

/ERROR/ 250 functions to determine the absolute value of the error signal 247 producing the absolute value thereof as 256.

Logic 257, responsive to the absolute value 256 of the error 247, the sign 255 of the error, and the previous count sequence modifications 252 and 254, will determine if a one is to be added 245 or subtracted 244 from the sequence of counting by Counter 215.

2-Bit Register 251 functions to store the previous modification of the count sequence of Counter 215; e.g., if the count sequence of Counter 215 was altered by either adding or subtracting a count by the present invention.

2-Bit Register 253 functions to store the modification of the count sequence of Counter 215 by the present invention previous to the sequence stored by 2-Bit Register 251.

Figure 12:
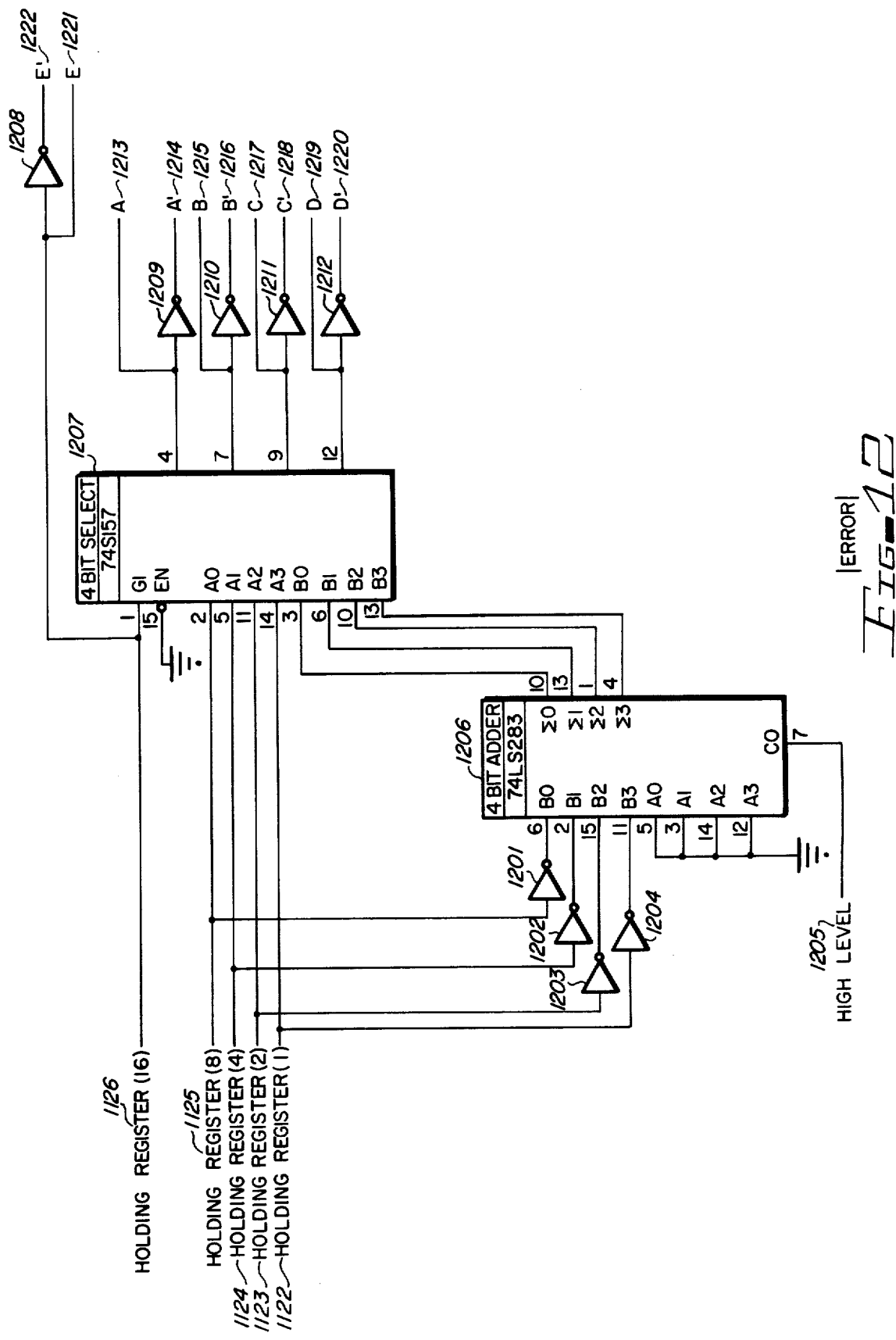
FIG. 12 illustrates the implementation /ERROR/ 250 shown in FIG. 2B.

FIG. 12 illustrates the implementation of /ERROR/ 250 which determines the absolute value 256 of the error 247, and the sign of the error 255. The error signal 247 is presented to one input of 4-Bit Selector 1207. The two's complement of the error signal 247 is formed by inverters 1201 through 1204, 4-Bit Adder 1206, and a one to carry input CO 1205 of 4-Bit Adder 1206 pin 7. The most significant bit of the error signal 247, Holding Register (16) 1126 is used to control the selection of which input to 4-Bit Selector 1207 is selected as outputs A 1213, B 1215, C 1217, D 1219, as well as the complements thereof A' 1214, B' 1216, C' 1218, and D' 1220. The sign 255 appears as E 1221, with the complement thereof formed by inverter 1208 as E' 1222.

Figure 13:
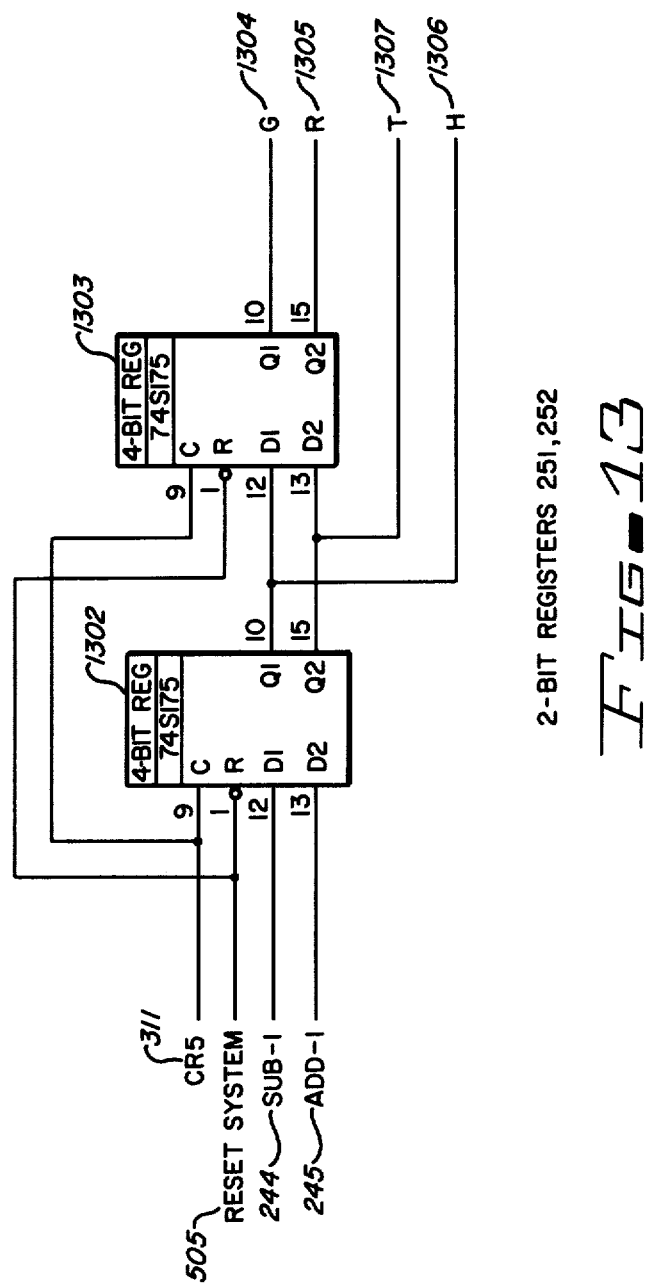
FIG. 13 illustrates the implementation of Logic 257, 2-Bit Register 251 and 2-Bit Register 253 shown in FIG. 2B.

FIG. 13 illustrates the implementation of 2-Bit Registers 251 and 252 shown in FIG. 2B by 4-Bit Registers 1302 and 1303.

From FIG. 13, the modification of the correct sequence of Counter 215 by adding one is stored in 4-Bit Registers 1302 and 1303 as Q1-Q2 equal to 0-1. In a similar manner, the modification of the count sequence of Counter 215 by subtracting one is stored in 4-Bit Registers 1302 and 1303 as Q1-Q2 equal to 1-0. No modification of the count sequence is stored in 4-Bit Registers 1302 and 1303 as 0-0.

Logic 257 shown in FIG. 2B, responsive to the magnitude 256 of the error 247, the sign 255 of the error 247, and the two previous modifications of the count sequence 252 and 254, will produce ADD-1 signal 245 and SUB-1 signal 244 to effect a one being inserted into or deleted from the count sequence of Counter 215. With the Boolean variables of A, B, C, D, E, G, H, R and T as appearing in FIGS. 12 and 13, the Boolean expression for ADD-1 245 and SUB-1 244 are:

ADD-1 = CT'E' + DT'R'E' + CDR'E' + AE' + BE'

SUB-1 = CH'E + DG'H'E + DCG'E + AE + BE

The Boolean expressions implement the phase correction according to the following description. If the error 247 has a value of one, and there was not an add correction to the counter 215 for the previous two count sequences of counter 215, then the ADD-1 245 signal is generated. If the error 247 has a value of two and there was not an add correction in the previous count sequence of counter 215, then the ADD-1 245 signal is generated. If the error 247 equals three, the ADD-1 signal 245 is generated only if neither of the previous two count sequences of counter 215 had an add correction. If error 247 is greater than three, the ADD-1 245 is always generated. The above conditions are similar for the negative case, which will in turn generate the SUB-1 244 signal for subtracting the value of one from the count sequence of counter 215.

As the present invention results in the modification of the count sequence performed by Counter 215, implementation of Counter 215 originally shown in FIG. 6 for a digital phase-locked loop, must be altered to provide for count sequence modification responsive to the present invention. The implementation of Counter 215 for use with the present invention is illustrated in FIGS. 14A and 14B.

Referring to FIG. 14A, the counting for Counter 215 is performed by Flip-Flop 1416 as the least significant bit, with 4-Bit Counter 1415 comprising the upper four bits.

When it is desired to add one to the count present in Counter 215, counting by Flip-Flop 1416 is inhibited for one count, with the count occurring instead in 4-Bit Counter 1415. Hence the counter will count two clock pulses instead of one, as implemented as follows.

When ADD-1 245 is high, Flip-Flop 1401 is set upon the occurrence of CR4 310. Assuming for the present that INHIBIT 1433 is high, the output from AND gate 1408 will be high, resulting in the output from NOR gate 1412 being low, and thereby enabling the counting of Clock 218 by 4-Bit Counter 1415. The output of AND gate 1408 being high will, due to inversion by Inverter 1409, result in the output from AND gate 1411 being low, thereby inhibiting the Clock 218 from reaching Flip-Flop 1416 through AND gate 1413.

When it is desired to subtract one from the count sequence present in Counter 215, the normal counting sequence is interrupted for a clock pulse. Hence the counter implemented by 4-Bit Counter 1415 and Flip- Flop 1416 will have a count subtracted from its counting sequence, as implemented as follows.

When SUB-1 is high, Flip-Flop 1402 is set upon the occurrence of CR4 310. Assuming for the present that INHIBIT 1433 is high, the output from NAND gate 1407 will be low, resulting in the output of AND gate 1411 being likewise low which inhibit Clock 218 from reaching Flip-Flop 1416 through AND gate 1413.

When it is desired for Counter 215 to count in its normal sequence, ADD-1 245 and SUB-1 244 will both be low, which upon the occurrence of CR4 310 will result in Flip-Flop 1401 and Flip-Flop 1402 Q outputs both being low. With Flip-Flop 1401 Q outputs low, AND gate 1408 output will be low, and the output from Inverter 1409 will be high. With Flip-Flop 1402 Q output being low, output from NAND gate 1407 will be high. Consequently, the output from AND gate 1411 will be high, enabling AND gate 1413 to pass Clock 218 to Flip-Flop 1416. 4-Bit Counter 1415 will be likewise enabled to count in the normal sequence the signal from the Q output of Flip-Flop 1416 through AND gate 1410, producing an enable signal from NOR gate 1412.

Flip-Flop 1403 functions to reset Flip-Flops 1401 and 1402.

The INHIBIT signal 1433, previously assumed to be high during count sequence modification of Counter 215, is high at all times except when the number present in Counter 215 is equal to or greater than the contents of Cumulative Count Register 213 after division thereof by eight by Divide-by-Eight 223 minus three, as implemented as shown in FIG. 14B. This is necessary due to the fact that if SUB-1 is produced when the contents of Counter 215 are close to the point of agreement with the contents of Cumulative Count Register 213 after division by eight by Divide-by-Eight 223, it is possible for the occurrence of SUB-1 to result in the count of Counter 215 being so modified as to result in being increased beyond the point of comparison. This problem is prevented by adding INHIBIT 1433 with the Q outputs of Flip-Flops 1401 and 1402.

We claim:

1. In a phase-locked loop circuit with an enhancement circuit, for producing an output signal having a phase difference which is constant with respect to an input signal, said input signal having a time period subject to fluctuations, said phase-locked loop circuit including a timing element for generating clock pulses, a register element for storing a total number of said clock pulses which occur in a predetermined number of time periods of said input signal to generate a first and a second output signal, said first output signal representative of the average number of said clock pulses which occur in a time period over said predetermined number of time periods of said input signal, and said second output signal representative of a predicted number of said clock pulses which are expected to occur between said output signal and said input signal, a counter element operatively connected to said timing element for counting said clock pulses whereby said counter element contains a value of counter clock pulses, a compare element operatively connected to said counter element and further operatively connected to said register element, for comparing the value of counted clock pulses to said first output signal to generate said output signal, said output signal operatively coupled to said counter element for resetting said counter element, and a subtractor element operatively coupled to the output terminal of said counter element and further operatively coupled to said register element, for generating a difference signal between the value of counted clock pulses and said second output signal in response to said input signal, said difference signal operatively coupled to said register element, wherein said enhancement circuit comprises:

(a) first means, having an input terminal adapted to receive an error signal, the input terminal of said first means operatively connected to said register element and to said subtractor element, for generating a numeric absolute value of said error signal and an algebraic sign of said error signal; and (b) logic means, having an input terminal adapted to receive the numeric absolute value of said error signal and the algebraic sign of said error signal, for generating a first signal and a second signal, said first and second signal being operatively coupled to said counter element, wherein the value of the counted clock pulses contained in said counter element is modified in response to said first and second signal.

2. In a phase-locked loop circuit according to claim 1, wherein said logic means comprises:

(a) a plurality of gate means for implementing a predetermined set of conditions to generate said first and second signal; and (b) means for storing information representative of at least one of said conditions.

* * * * *